United States Patent [19]

Sachdev et al.

[11] Patent Number: 5,296,332

[45] Date of Patent: Mar. 22, 1994

[54] CROSSLINKABLE AQUEOUS DEVELOPABLE PHOTORESIST COMPOSITIONS AND METHOD FOR USE THEREOF

[75] Inventors: Harbans S. Sachdev, Hopewell Junction; Willard E. Conley, Cornwall; Premlatha Jagannathan, Patterson; Ahmad D. Katnani, Poughkeepsie; Ranee W. Kwong, Wappingers Falls; Leo L. Linehan, Walden; Steve S. Muira, Poughkeepsie; Randolph J. Smith, Newburgh, all of N.Y.

[73] Assignee: International Business Machines Corporation, Armonk, N.Y.

[21] Appl. No.: 796,155

[22] Filed: Nov. 22, 1991

[51] Int. Cl.$^5$ .......................... G03C 5/56; G03C 1/73; G03C 1/76

[52] U.S. Cl. .......................... 430/270; 430/272; 430/280; 430/312; 430/315

[58] Field of Search ............... 430/270, 272, 280, 312, 430/315

[56] References Cited

U.S. PATENT DOCUMENTS

| 4,404,272 | 9/1983 | Stahlhofen | 430/192 |
| 4,810,601 | 3/1989 | Allen et al. | 430/18 |
| 5,073,474 | 12/1991 | Schwalm et al. | 430/325 |
| 5,206,111 | 4/1993 | Wilharm et al. | 430/270 |
| 5,227,276 | 7/1993 | Roeschert et al. | 430/270 |
| 5,234,791 | 8/1993 | Dammel et al. | 430/270 |

FOREIGN PATENT DOCUMENTS 0361907  9/1989  European Pat. Off.

OTHER PUBLICATIONS

Reck et al.; *SPIE Regional Technical Conference on Photopolymers*, Ellenville, N.Y. 63 (1988) "Novel Photresist Design Based on Electrophilic Aromatic Substitution".

*Primary Examiner*—Susan Berman
*Attorney, Agent, or Firm*—John A. Stemwedel; Dale M. Crockatt

[57] ABSTRACT

High sensitivity, high contrast, heat-stable resist compositions for use in deep UV, i-line e-beam and x-ray lithography. These compositions comprise a film-forming polymer having aromatic rings activated for electrophilic substitution, an acid catalyzable crosslinking agent which forms a hydroxy-stabilized carbonium ion, and a photoacid generator. The compositions are aqueous base developable.

24 Claims, 2 Drawing Sheets

CROSSLINKABLE AQUEOUS DEVELOPABLE PHOTORESIST COMPOSITIONS AND METHOD FOR USE THEREOF

FIELD OF INVENTION

The present invention relates to aqueous base developable photoresist compositions and processes forming lithographic patterns therewith.

BACKGROUND OF THE INVENTION

There has been a continuing desire in the electronics industry to obtain higher circuit density in microelectronic devices. To achieve the higher degree of integration necessary to meet the ground rules for such devices, the microelectronic industry has sought to develop improved lithographic tools and techniques which in turn have increased the demand for new photoresists which enhance the resolution of lithographic patterns in such photoresist films.

Aqueous base developable photoresist compositions which crosslink through electrophilic aromatic substitution have been disclosed in Reck et al., *SPIE Regional Technical Conference on Photopolymers*, Ellenville, N.Y., 63 (1988). Such formulations are characterized by having 3 structural components which include (a) an aromatic moiety, such as poly(4-hydroxystyrene) or novolak, which is susceptible to electrophilic aromatic substitution (b) a stable substance which is capable upon reaction with acid, of generating an electrophile, viz., a carbocationic species whose precursor is the acetate of an aryl methylol, and (c) a photo-acid generator which is an onium salt such as triphenylsulfonium hexafluoroantimonate. Upon exposure latent images are formed due to the chemical changes caused by the photoacid generation which include acetate hydrolysis, benzylic carbonium ion formation, and partial crosslinking of the aromatic resin. When the film is baked briefly after exposure, the acid cleaves the acetate group of the latent electrophile to produce a benzylic carbocationic species which reacts immediately with the surrounding phenolic resin to form new carbon-carbon bonds. Such formation of new carbon-carbon bonds results in an increase in molecular weight of the resin or its crosslinking, thereby drastically altering its solubility properties. Subsequent development in dilute base affords a negative-tone image of the mask. (Systems which included novolak resins were said to exhibit an unacceptable high optical density in deep UV).

U.S. Pat. No. 4,810,601 to Allen et al. is concerned with the formation of negative tone patterns by crosslinking an aromatic compound with a monomeric or polymeric source of polyfunctional carbonium ions. Diacetoxymethylbenzene and trisacetoxymesitylene were used with triphenylsulfonium hexafluoroantimonate to crosslink a poly(p-hydroxystyrene) matrix resin. The imaged resist was aqueous base developable. Poly(vinylbenzylacetate) was used as a polymeric polyfunctional carbonium ion generator to crosslink Bisphenol A. The resist patterns formed with these systems were briefly baked and then developed with an organic solvent such as acetone.

European Patent Application No. EP 0 361 907 is directed to photoresist compositions which are useful for deep UV image reversal processes which comprise an organic film-forming material, an oxime sulfonate photoacid generator, and an additive which can crosslink the film-forming material and increase the positive photospeed of the composition. The additives have the general formula RO—$CH_2$—A—$CH_2$—OR where A is a monomeric aromatic hydrocarbon having one or more fused or unfused, separated or unseparated rings and each R unit is independently H, ($C_1$–$C_6$) alkyl, ($C_3$–$C_6$)cycloalkyl, aryl or arylalkyl. The additives have the general formula

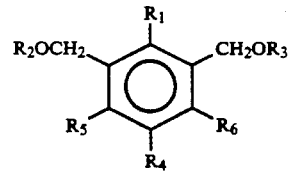

wherein $R_1$, $R_4$, $R_5$, $R_6$ are independently H, ($C_1$–$C_6$)alkyl, ($C_3$–$C_6$) cycloalkyl, aryl, arylalkyl or $OR_2$; and $R_2$, $R_3$ are independently H, ($C_1$–$C_6$)alkyl, ($C_3$–$C_6$)cycloalkyl, aryl, or arylalkyl.

U.S. Pat. No. 4,404,272 to Stalhofen is concerned with aqueous developable light sensitive compositions comprising novolak resins having brominated phenol units. These compositions may include hot curable hydroxymethylphenol deritives to enhance adhesion of the compostion to the substrate. The derivitives include

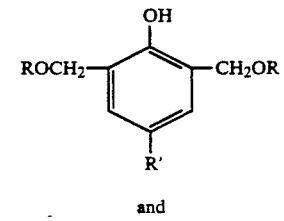

and

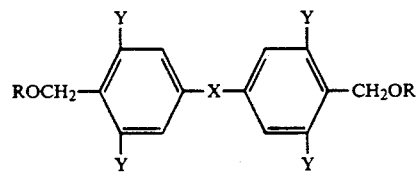

where R is a hydrogen atom, a lower alkyl group, or a lower acyl group, preferable a hydrogen atom, R' is an alkyl, alkoxy, cycloalkyl, aryl, aryloxy, acyl or aralkyl group or a halogen atom, X is a single bond or one of the groups S, O, CO or $CR'R^2$, preferably a prop-2,2-ylene group, and Y is a hydrogen atom or, preferably, a $CH_2OH$ group, $R^1$ and $R^2$ being identical or different and representing hydrogen atoms or substituted or unsubstituted alkyl groups which can be linked to one another to form a ring, and not more than two of the substituents Y being hydrogen atoms. These results depend upon the cleaveage of an acetate or an orthocarboxylic compound to give positive images.

SUMMARY OF THE INVENTION

The present invention relates to aqueous base developable photoresist compositions for generating negative tone resist images on a substrate. These compositions comprise, in admixture, (a) a film-forming aromatic polymer resin having functional groups which activate the resin to aromatic electrophilic substitution, (b) an acid catalyzable crosslinking agent which forms a stabilized carbonium ion upon reaction with acid, and (c) a radiation degradable acid generator which is adapted to absorb imaging radiation to crosslink the composition in the exposed regions. The crosslinking agent preferably forms hydroxy stabilized benzyl carbonium ions. The crosslinking agent is a polyfunctional monomer selected from the group consisting of 2,6-dihydroxymethyl-p-cresol, 2,6-diacetoxymethyl-p-cresol, 2,6-dihydroxymethyl-phenol, 2,6-diacetoxymethylphenol, 2,2',6,6'tetra-hydroxymethyl Bisphenol A, 2,2',6,6'tetraacetoxymethyl Bisphenol A, and trisacetoxymesitylene.

The activating groups are phenolic hydroxy groups in aromatic polymeric resins such as poly(hydroxystyrene), poly(hydroxy-styrene-co-t-butyloxy-carbonyloxystyrene), poly(hydroxystyrene-co-hydroxymethylstyrene), poly(hydroxystyrene-coacetoxymethylstyrene), and novolak resin.

In an alternative embodiment of the present invention, an aromatic dye may be included in the composition.

The present invention also provides the method of using new resist compositions for generating negative tone resist images on a substrate which comprises the steps of:

(a) coating the substrate with a film comprising (i) a film forming aromatic polymer resin having functional groups which activate the resin to electrophilic aromatic substitution, (ii) an acid catalyzable crosslinking agent which forms carbonium ions upon reation with acids, and (iii) a radiation degradable acid generator which is adapted to absorb imaging radiation.

(b) imagewise exposing the film with radiation to cause crosslinking in the exposed portion of the film, and (c) developing this film with an aqueous base developer.

An oligomeric additive which preferentialy enhances the dissolution rate of the unimaged areas while the crosslinked areas are essentially unaffected by the metal ion free basic developer is preferred when the composition is used for e-beam imaging. These novel compositions afford high contrast and high sensitivity sub-half micron patterns and allow a wide process latitude necessary for printing high density patterns of varying dimensions.

The present compositions are sensitive to deep UV, e-Beam and x-ray and are easily adapted for sensitivity to i-line and g-line radiation by incorporating in the resist composition an appropriate sensitizer or an energy transfer agent. Also, the resist speed can be adjusted by selecting appropriate polycarbonium ion precursors which include primary, secondary and/or tertiary benzylic alcohols, their esters and ethers. The polyfunctional carbonium ion precursors of this invention are readily available materials without complex or expensive synthesis which in addition to being cost effective give excellent overall resist performance. Although, in the preferred embodiment only monomeric crosslinkers are given, the present invention is equally extendable to polymeric carbonium ion precursors.

A more thorough disclosure of the present invention is presented in the detailed description which follows and in the accompanying drawings.

DETAILED DESCRIPTION OF THE INVENTION

Figure 1:
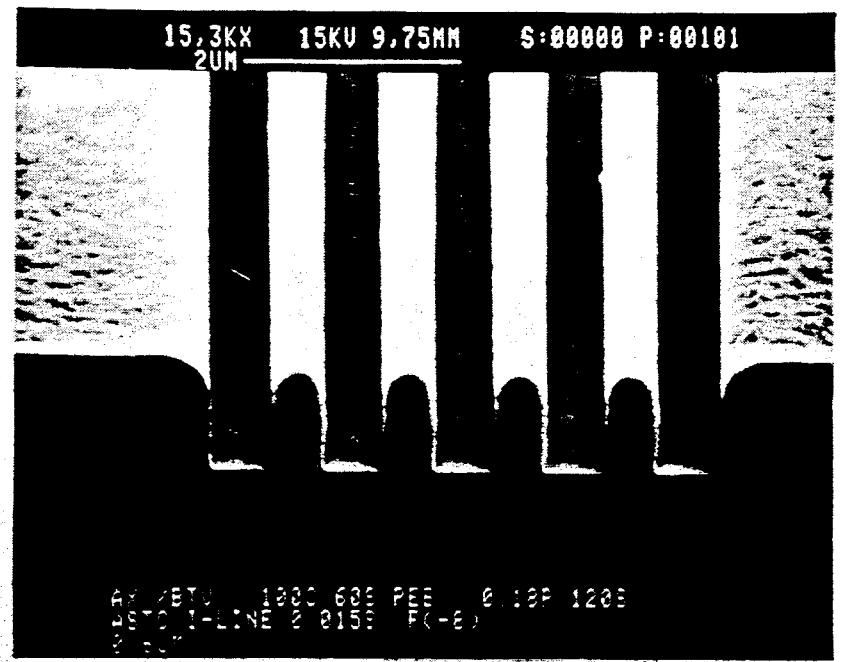
FIGS. 1 through 4 are photomicrographs showing images made using the compositions of the invention.

The present invention relates to high sensitivity, high contrast aqueous base developable photoresist compositions for generating negative tone resist images on a substrate. These compositions comprise, in admixture, (a) a film-forming aromatic polymer resin having functional groups which activate said resin to stabilize said resin to aromatic electrophilic substitution, (b) an acid catalyzable crosslinking agent which forms a stabilized carbonium ion upon reaction with acid, and (c) a radiation degradable acid generator which is adapted to absorb imaging radiation to crosslink the composition in the exposed regions. The compositions are halogen free and are compatable with metal ion free developers. The crosslinking agent preferably forms hydroxy stabilized benzyl carbonium ions. The crosslinking agent is a polyfunctional monomer selected from the group consisting of 2,6-di-hydroxymethyl-p-cresol, 2,6-diacetoxymethyl-p-cresol, 2,6-dihydroxymethylphenol, 2,6-di-acetoxymethylphenol, 2,2',6,6'tetrahydroxymethyl Bisphenol A, 2,2',6,6'tetraacetoxymethyl methyl Bisphenol A, trisacetoxymesitylene.

The activating groups are phenolic hydroxy groups in aromatic polymeric resins such as poly(hydroxystyrene), poly(hydroxystyrene-co-hydroxymethylstyrene), poly(hydroxystyrene-co-acetoxymethylstyrene), and novolak resin.

As is well known in the art, the skilled artisan will appreciate that aromatic polymeric resins having activating groups other than phenolic hydroxy groups, which aromatic polymeric resins are also capable of undergoing crosslinking reactions by electrophilic aromatic substitution, will similarly be useful and may be substituted for the phenolic hydroxy comprising polymeric resins of the present invention.

In an alternative embodiment of the present invention, an aromatic dye may be included in the composition.

The present invention also provides processes for generating negative tone resist images on a substrate comprising the steps of:

(a) coating the substrate with a film comprising (i) a film-forming aromatic polymer resin having functional groups which activate said resin to electrophilic aromatic substitution, (ii) an acid catalyzable crosslinking agent which forms a stabilized carbonium ion upon reaction with acid, and (iii) a radiation degradable acid generator which is adapted to absorb imaging radiation to crosslink the composition in the exposed regions;

(b) imagewise exposing of the film to mid or deep UV radiation to cause crosslinking of the resin in the exposed portion of the film; and, (c) developing said film with an aqueous base developer to yield a negative resist pattern.

In the first step of the process of the present invention, a suitable substrate such as silicon, silicon oxide, silicon nitride or gallium arsenide is coated with a film comprising the resist composition which is dissolved in a suitable organic solvent.

The aromatic polymer resin has functional groups which are preferably phenolic hydroxy groups, which activate the aromatic ring to electrophilic aromatic substitution. Typically such aromatic polymer resins will be activated ring systems such a polyhydroxystyrene or novolak resins. These materials include copolymers thereof and should be considered to comprise poly(hydroxystyrene), poly(hydroxystyrene-co-hydroxymethylstyrene), poly(hydroxystyrene-co-acetoxymethylstyrene) alkyl substituted polyvinyl phenols and novolak resins such as cresol novolak, ethylphenol novolaks, xylenol novolaks, etc.

The acid catalyzable crosslinking agent is a carbonium ion precursor. The preferred carbonium ions are benzylic carbonium ions, that is, phenylmethylene in form, and more than one carbonium ion site may be present on the precursor. Typical functional groups which react with acid to form carbonium ions are acetate groups on benzyl acetate type structures. The aromatic ring may be part of a polymer chain or be monomeric and may contain substituents which promote the formation and stabilization of the carbonium inn. The substituents must however be compatible with the imaging and stability characteristics of the final resist formulation. Preferred substituents include hydroxy (—OH), lower alkyl (preferably —CH$_3$), and substituted lower alkyl (preferably —CH$_2$OAc, where OAc is acetate).

The skilled artisan will appreciate that acid catalyzable crosslinking agents comprising at least one aromatic ring which has at least one electron donating, carbonium ion stabilizing substituent other than acetoxymethyl, alkyl, or hydroxy groups will similarly be useful and may be substituted for crosslinking agents having the enumerated preferred substituents without deviating from the spirit and scope of the present invention.

The functional groups are leaving groups in the formation of carbonium ions. The photospeed of the resist composition may be adjusted by the selection of an appropriate leaving group. The hydroxy (—OH) group is most tightly bound to the benzyl carbon, needing more energy to remove it, thus causing a relatively slow photospeed. Alkoxy is less tightly bound and this gives a faster photospeed. Acetate being a much better leaving group gives even further enhanced photospeed. Compositions are formulated with imaging tools in mind. For a formulation suitable for i-line imaging where the exposure tools have an abundance of radiation imaging intesity, the preferred compositions use the hydroxymethyl derivatives; whereas for deep UV imaging, formulations having acetate leaving groups are preferred since the exposure tools operate at much lower intensity at 250 nm (except for excimer laser tools).

The preferred crosslinking agents of the present invention are polyfunctional carbonium ions precursor monomers. The crosslinking agent preferable forms hydroxy group stabilized benzylic carbonium ions. These carbonium ion precursors are selected from the group consisting of 2,6 dihydroxymethyl-p-cresol, 2,6-diacetoxymethyl-p-cresol, 2,6-dihydroxymethyl Bisphenol A. Trisacetoxymesitylene and bisacetoxyxylene may also be used.

Also secondary and tertiary carbonium ion precursors are functionally equally suitable crosslinking agents and are used in the same way as the primary carbonium ion systems are.

In the secondary polycarbonium ion precursor category, the preferred materials are 1,3-α,α-bishydroxyethylbenzene, 1,4,-α,α bishydroxyethylbenzene, an 1,3,5,α,α,α-trishydroxyethylbenzene. Among the tertiary carbonium ion based crosslinkers the preferred representative materials are α,α,α',α'-tetramethyl-1,4-benzenedimethanol and α,α,α',α'-tetramethyl-1,3-benzenedimethanol.

The useful monomeric crosslinking agents are of the form of diacetoxymethyl phenolic monomers. It has been found that having the acetoxymethyl groups in the ortho position with respect to a phenolic hydroxy group promotes stabilized carbonium ions. The preferred monomeric carbonium ion precursors include 2,6-diacetoxymethyl-p-cresol, 2,6-diacetoxymethylphenol, 2,2',6,6'-tetracetoxymethyl Bisphenol A and trisacetoxy mesitylene.

Suitable photoacid generators for use in the present invention include radiation degradable acid generators (sometimes known as photoacids). These photoacids include metallic and non-metallic onium salts and non-metallic sulfonic acid precursors which generate strong acids upon exposure to radiation. Typical of the onium salts are diaryliodonium and triarylsulfonium salts. These photoacids may include the well known diaryl iodonium and triarylsulfonium metalate salts as well as diphenyliodonium triflate, di(t-butylphenyl)-iodonium triflate, triphenylsulfonium triflate and tri(t-butylphenyl) sulfonium triflate, as well as the corresponding tosylates and benzene sulfonates.

Among the non-metallic sulfonic acid precursors which generate strong acids upon exposure to radiation are N-sulfonyloxyimides of the form

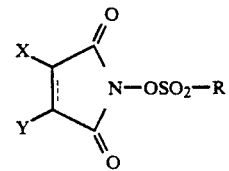

where R is selected from the group consisting of toluene, benzene, —CF$_3$, —CF$_2$CF$_3$, —CF$_2$CF$_2$H, —(CF$_2$)$_n$—Z where n=1 to 4, where Z is H, alkyl, aryl,

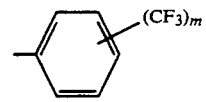

or

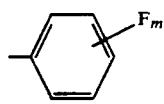

where m=1 to 5, where X any Y either (1) form a cyclic or polycyclic ring which may contain one or more hetero atoms, (2) form a fused aromatic ring, (3) may be independently H, alkyl or aryl, (4) may be attached to another sulfonyloxyimide-containing residue, or (5) may be attached to a polymeric chain or backbone.

The film may also comprise an aromatic dye which functions to absorb substantially all imaging mid and deep UV radiation incident on the film during the process before it reaches the substrate. The imaging mid and deep UV radiation used to process the present invention preferably has a wave length of from about 200 to about 370 nm. Suitable dyes include phenoxymethyl anthracene, anthracenemethanol, 9,10-diphenylanthracene, and phenanthracene and biphenyl derivatives.

This reaction is accelerated by a brief heating of the wafer from 60° to 110° C. for one to three minutes. The imaged areas are thus rendered less soluble or insoluble as compared to the unexposed areas which are removed by developing in metal ion free developer such as tetramethylammonium hydroxide (TMAH). The imaged areas are thus left behind.

In an alternative embodiment of the present invention for i-line and g-line applications, requisite sensitizer or energy transfer agent is preferably also included in the formulation. One such sensitizer preferred for i-line application is anthracenemethanol. For sensitivity to long wavelength radiation, other sensitizers such as acenaphthalene, thioxanthone, methyl-2-naphthyl ketone, 4-acetylbiphenyl, and 1,2-benzofluorene may be included in the resist formulation.

In yet another embodiment of the present invention for sensitizing the above formulation to e-beam and x-ray radiation, in the preferred formulation an oligomeric polyether diol is incorporated, for example, when in the above formulation polytetrahydrofuran (Mol. Wt. 200-1000) is added as 0.1 to 2% of the total solids, the resist process window and contrast gamma are significantly enhanced. Other such additives that are effective in the same manner are polyethylene glycol (Mol. Wt. 200-1000) and polypropylene glycol (Mol. Wt. 200-1000).

The compositions are carried in a solvent or solvent system which is adapted to efficient film-forming for the composition. The needs which the solvents fill include providing uniform coating with complete coverage of the resist components in a substrate. The solvent must evaporate at a temperature such that the photoactivity of the resist is not adversely impacted in the drying step after coating of the resist. The solvents should be safe to handle, convenient to use, and as inexpensive as can be found since they take no part in the operation of the photoresist after its application and coating. The solvent will be polar or mostly polar and will include alcohol and alcohol derivateves as well as alcohol-ether, alcohol-ester and ester-ether solvents. Typical of these solvents are propylene glycol monomethyl ether acetate (PM acetate), ethyl-3-ethoxypropionate (EEP)(ether-exters), methyoxypropanol, ethoxypropanol, and butoxypropanol (alcohol-ether). Other solvents will become apparent to those of skill in the art.

When the photoresist compositions are compounded for use in e-beam exposure processes it is further desired to provide an agent to prevent excess or background crosslinking due to proximity and like effects. In that mixture there is included an oligomeric diol ether additive which improves image contrast. The preferred diol ethers are polytetrahydrofuran, polyethylene glycol and polypropylene glycol.

When such oligomer diol ether additive is used, it is also preferred that there be a cosolvent so that the solvent system is, for example, comprised of an ester-ether and an alcohol ether. An example of such solvent-cosolvent system is PM acetate and 1-methoxy-2-propanol.

In the second step of the process of the present invention, the film is imagewise exposed to mid or deep UV radiation to crosslink the aromatic polymer in the exposed region of the film. Suitable radiation sources include various mercury arc lamps and deuterium or excimer laser sources. The film may also be imaged with e-beam or x-ray radiation.

In the third step of the process of the present invention, the film is contacted with an aqueous base developer to yield negative tone wet-developed images. The developers include potassium hydroxide (KOH) and metal ion-free (MIF) bases such as tetraalkyl ammonium hydroxide. Tetramethylammonium hydroxide (TMAH) is most preferred.

The following examples are detailed descriptions of methods of preparation and use of the process of the present invention. The detailed preparations fall within the scope of, and serve to exemplify, the more generally described methods set forth above. The examples are presented for illustrative purposes only, and are not intended to restrict or limit the scope of the invention.

EXAMPLE 1

2,6-bis(acetoxymethyl)-p-cresol was compounded into a photoresist formulation such that there was 17.47% (w/w) poly-(p-hydroxystyrene), 1.22% (w/w) 2,6-bis(acetoxymethyl)-p-cresol, 0.54% (w/w) 9-anthracene methanol, 79.56%(w/w) PM acetate propylene glycol methyl ether acetate and 1.22% (w/w) MDT (trifluoromethylsulfonyloxybicyclo[2.2.1]-hept-5-ene-2,3-dicarboximide), a non-metallic sulfonic acid precursor described in U.S. patent application Ser. No. 07/322,848 filed Mar. 14, 1989, now abandoned, the disclosure of which is incorporated into the present application. This photoresist formulation was spin coated onto HMDS primed silicon wafers to form a 1.1 $\mu$m thick coating. The coated wafers were baked at 90° C. for one minute on a hot-plate and were then exposed with ca. 20 mJ/cm$^2$ of 365 nm light using a 0.45NA GCA I-line step and repeat tool. The wafers were post-exposed baked on a hot-plate at 100° C. for 120 seconds. Wafers were then immersion developed in 0.17N aqueous TMAH (FIG. 1).

EXAMPLE 2

Figure 2:

2,6-bis(acetoxymethyl)-p-cresol was compounded into a photoresist formulation such that there was 23.64% (w/w) novolak (m-cresol/p-cresol co-polymer), 2.36% (w/w) 2,6-bis(acetoxymethyl)-p-cresol, 70.92% (w/w) PM acetate and 3.07% (w/w) MDT. This photoresist formulation was spin coated onto HMDS primed silicon wafers to form 1.1 $\mu$m thick coatings. The coated wafers were baked for 60 seconds on a 90° C. hot-plate and were then exposed with 8.0 $\mu$C/cm, of 50 KeV electrons. The wafers were baked after exposure for 180 seconds on a 100° C. hot-plate after which they were immersion developed in 0.32N aqueous TMAH (FIG. 2).

EXAMPLE 3

Figure 3:
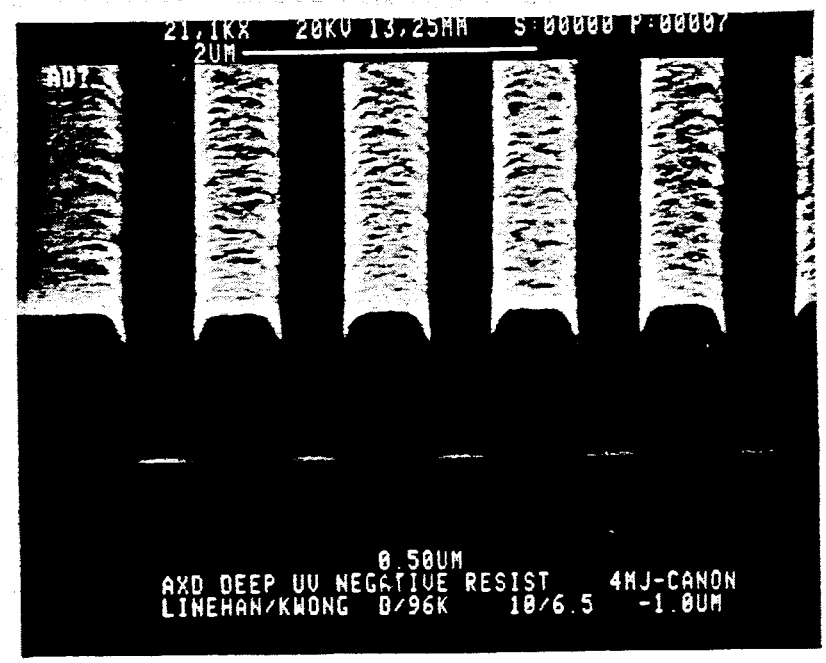

2.6-bis(acetoxymethyl)-p-cresol was compounded into a photoresist formulation such that there was 17.56% (w/w) poly(p-hydroxystyrene), 1.23% (w/w) 2,6-bis(acetoxymethyl)-p-cresol, 79.98% (w/w) PM acetate and 1.23% (w/w) MDT. This photoresist formulation was spin coated onto HMDS primed silicon wafers to form 1.1 $\mu$m thick coatings. Coated wafers were then baked for 60 seconds on a 90° C. hot-plate and exposed with 4.0 mJ/cm$^2$ of 248 nm light using a CANON 0.37 NA excimer step and repeat tool. The wafers were baked for 120 seconds at 100° C. after exposure and immersion developed in 0.17N aqueous TMAH (FIG. 3).

EXAMPLE 4

Figure 4:
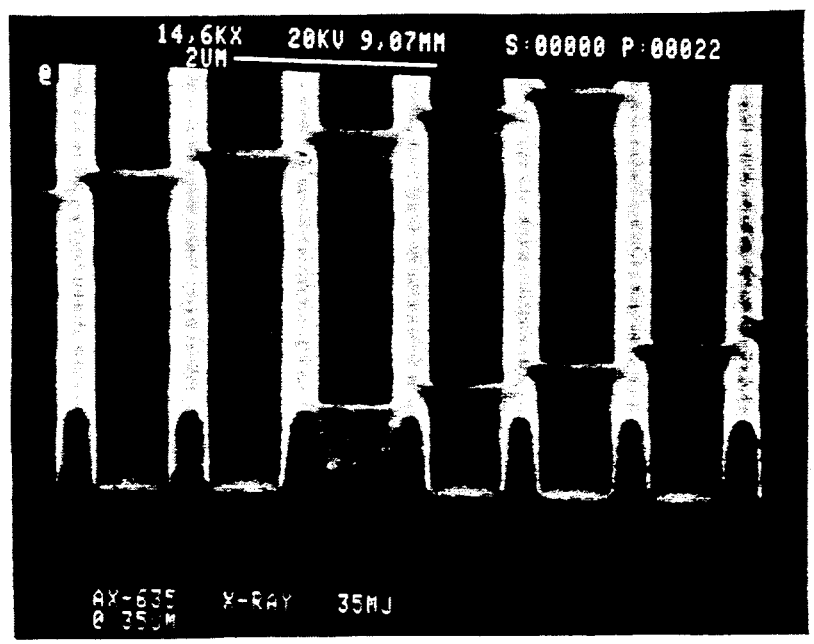

The photoresist formulation used in Example 2 was spin coated onto HMDS primed silicon wafers to form 1.0 μm thick films. Coated wafers were then baked at 90° C. for 60 seconds and exposed with 35 mJ/cm² of 10 Å radiation using a Karl Süss step and repeat tool at the Brookhaven National Laboratory Synchrotron Source. The wafers were baked for 120 seconds at 100° C. after exposure and immersion developed in 0.32N aqueous TMAH (FIG. 4).

EXAMPLE 5

A composition of 1% (w/w) 4,4' bis(hydroxyethyl)-benzene, 0.67% MDT, 22.22% (w/w). Novolak and 76 11% (w/w) PM acetate was spin coated onto HMDS primed silicon wafers to form μm thick coatings. The coated wafers were baked for 60 seconds on a 90° C. hotplate and were then exposed to DUV (248 nm) radiation receiving a 6 mJ/cm² dose using a CANON 0.37NA excimer stepper. It was followed by a 90 second post exposure bake (PEB) at 80° C. and development in aqueous TMAH for 90 seconds which gave 0.35 μm images.

EXAMPLE 6

The formulation of Example 5 was prepared and spin coated on silicon wafers as described in the above Example 5. The coated wafers were then exposed to 2.5 μC/cm² dose of electron beam energy at 50 KeV followed by a 90 second PEB at 90° C. and development in TMAH for 120 seconds.

EXAMPLE 7

A composition of 2.16% (w/w) α,α,α',α'-tetramethyl-1,4-benzene dimethanol, 2.16% (w/w) of tosylate analog of MDT (p-toluenesulfonyloxybicyclo[2.2.1]-hept-5-ene-2,3-dicarboximide, 21.6% poly(hydroxystyrene), 0.65% (w/w) anthracenemethanol, 74.43% (w/w) PM acetate was spin coated onto HMDS primed silicon wafers to give 1 μm thick coating. The coated wafers were baked for 60 seconds on a hotplate of 90° C. and were then exposed to i-line (365 nm) radiation receiving a 100 mJ dose using a GCA 0.35NA stepper. It was followed by a 60 second PEB at 100° C. and pattern development carried out in aqueous TMAH for 120 seconds.

EXAMPLE 8

A composition of 2.17% (w/w) α,α,α',α'-tetramethyl-1,4-benzenedimethanol, 2.17% (w/w) tosylate analog of MDT, 21.71% (w/w) novolac and 73.96% (w/w) PM acetate was spin coated onto HMDS primed silicon wafers to give 1 μm thick coatings. The coated wafers were baked for 60 seconds on a 90° C. hotplate and were then exposed to 3 μC/cm² dose of electron beam energy at 50 Kev. It was followed by a 90 second PEB at 90° C. and development in aqueous TMAH for 90 seconds.

EXAMPLE 9

A formulation with 3.76% (w/w) 2,6-diacetoxymethyl-p-cresol, 2.35% (w/w) MDT, 23.53% (w/w) novolak, and 0.376% (w/w) polytetrahydrofuran (Aldrich, MW 250) and 70% (w/w) PM acetate was spin applied to give 1.0 μm thick film after a bake at 90° C. for 60 sec. E-beam exposures were carried out using 7 μC/cm² dose at 50Kev. After a bake at 101° C. for 4 min excellent submicrom patterns were developed from 0.32N TMAH in less than 230 sec of development time.

EXAMPLE 10

A formulation with 3.76% (w/w) 2,6-diacetoxymethyl-p-cresol, 2.35% (w/w) MDT, 23.47% (w/w) novolak, and 70.42% PM (w/w) acetate was spin applied to give 1.5 μm thick film after a bake at 90° C. for 60 sec. The resist was exposed with e-beam using 7 μC/cm² dose at 50 Kev. In contrast to Example 9, after a bake at 101° C. for 4 min. the unexposed areas did not show any sign of development from 0.32N TMAH for a development time of 230 sec.

EXAMPLE 11

A formulation with 2.6% (w/w) 2,6-diacetoxymethyl-p-cresol, 2% MDT, 1% (w/w) anthracenemethanol, 14.4% poly(hydroxybenzylsilsesquioxane) and 80% (w/w) PM acetate was spin coated over a layer of hardbaked 1 μm diazoquinone novolak resin to obtain a 0.4 μm thick top resist layer. The film was baked after apply on a hot plate at 90° C. for 90 sec. I-line exposure were carried out on a Canon 0.52 NA tool for 100 milliseconds followed by a postexposure bake at 100° C. for 90 sec. Images down to 0.4 μm were resolved after development in 0.21 N TMAH for 60 sec. Pattern transfer with straight side walls was achieved with O₂ RIE.

EXAMPLE 12

A formulation with 2.6% (w/w) 2,6-diacetoxymethyl-p-cresol, 2% MDT (w/w), 15.4% (w/w) poly(hydroxybenzylsilsesquioxane) and 80% (w/w) PM acetate was spin coated over a layer of hardbaked 1 μm diazoquinone novolak resin to obtain a 0.4 μm thick top resist layer. The film was baked after application for 90 sec on a hot plate at 90° C. Deep UV exposures were carried out on a Canon 248 nm excimer laser tool (0.37NA) at a nominal dose of 27 mJ/cm² followed by a post exposure bake of 100° C. on a hotplate for 90 sec. Excellent sub-half micron images were developed with 0.21N TMAH solution in about 60 sec. Excellent residue-free patterns were transferred into the underlayer with O₂ RIE.

EXAMPLE 13

A formulation with 2% (w/w) 2,6-diacetoxymethylp-cresol, 2% MDT (w/w), 16% (w/w) poly(hydroxybenzylsilsesquioxane) and 80% PM acetate was spin coated over a layer of hardbaked 1 μm diazoquinone novalak resin to obtain a 0.4 μm thick top resist layer. The film was baked after application for 90 sec on a hot plate at 90° C. E-beam exposures were carried out using 3 μC/cm² dose at 50 Kev. After a bake at 100° C. for 90 sec, excellent sub-half micron images were developed with 0.21N TMAH in about 1 minute. The patterns were transferred to the underlayer using O₂ RIE providing vertical sidewalls with virtually no residue.

EXAMPLE 14

A photoresist formulation was prepared by combining 1.69% (w/w) MDT, 1.69% (w/w) bis(hydroxymethyl)-p-cresol) 1.90% w/w 9-anthracene methanol, 18.67% (w/w) cresol-formaldehyde novalak resin, 38.02% (w/w) 1-methoxy-2-propanol and 38.02% PM acetate. This photoresist was spin coated onto HMDS primed silicon wafers and baked at 90° C. for 60 seconds to a thickness of 1.1 μm. The wafers were then exposed using a GCA 1635i i-line step and repeat tool at 30 mJ/cm². After a post exposure bake at 100° C. the resist was spray developed using 0.24N TMAH developer. Images with straight sidewalls were obtained down to 0.5 μm.

EXAMPLE 15

A formulation similar to that of Example 14 was prepared where 2.39% (w/w) of p-chlorobenzenesulfonyloxy-5-norbornene-2,3-dicarboximide was substituted for the MDT. The resist was processed as above. It had a sensitivity of 110 mJ/cm² and a profile similar to that in Example 14.

Although this invention has been described with respect to specific embodiments, the details thereof are not to be construed as limitations, for it will be apparent that various embodiments, changes and modifications may be resorted to without departing from the spirit and scope thereof, and it is understood that such equivalent embodiments are intended to be included within the scope of this invention.

We claim:

1. An aqueous base developable negative tone photoresist composition comprising, in admixture:
   (a) a film-forming aromatic polymer resin having functional groups which activate said resin to electrophilic aromatic substitution,
   (b) an acid catalyzable crosslinking agent which forms a carbonium ion upon reaction with acid, which carbonium ion is stabilized by the presence of one or more electron donating substituents on the crosslinking agent,
   (c) a radiation degradable acid generator which forms an acid upon exposure of the photoresist composition to imaging radiation, which acid reacts with the crosslinking agent causing the composition to crosslink in the exposed regions, and which acid generator is selected from the group consisting of metallic onium salts, metalloid onium salts, nonmetallic onium salts, and esters which are sulfonic acid precursors, and
   (d) an oligomeric ether diol additive having a molecular weight in the range from about 200 to about 1000 Daltons, and which increases the dissolution rate of the unexposed portion of the photoresist composition.

2. The aqueous base developable photoresist composition of claim 1 which further comprises a solvent selected from the group consisting of propylene glycol monomethyl ether acetate, ethyl-3-ethoxypropionate and ethyl lactate.

3. The aqueous base developable photoresist composition of claim 2 wherein the said catalizable, crosslinking agent is selected from the group consisting of 2,6-dihydroxymethyl-p-cresol,2,6-dihydroxymethylphenol and 2,2',6,6'-tetrahydroxymethyl Bisphenol A and the composition further comprises a cosolvent selected from the group consisting of 1--methyl-2-propanol, ethoxypropanol and butoxypropanol.

4. The aqueous base developable photoresist composition of claim 1 wherein the acid catalyzable crosslinking agent forms a hydroxy stabilized benzyl carbonium ion.

5. The aqueous base developable photoresist composition of claim 4 wherein said acid catalyzable crosslinking agent is selected from the group consisting of 2,6-diacetoxymethyl-p-cresol, 2,6-diacetoxymethylphenol, 2,2',6,6'tetra(acetoxymethyl)Bisphenol A, and trisacetoxymesitylene.

6. The aqueous base developable photoresist composition of claim 1 wherein the carbonium ion formed is a secondary carbonium ion.

7. The aqueous base developable photoresist composition of claim 6 wherein the acid catalyzable crosslinking agent forms secondary benzylic carbonium ions.

8. The aqueous base developable photoresist composition of claim 7 wherein said acid catalizable crosslinking agent is selected from group consisting of 1,3-α,α'-bishydroxyethylbenzene, 1,4-α,α'-bishydroxyethylbenzene and 1,3,5-α,α',α''-trishydroxyethylbenzene.

9. The aqueous base developable photoresist composition of claim 1 wherein the acid catalyzable crosslinking agent forms a tertiary carbonium ion.

10. The aqueous base developable photoresist composition of claim 9 wherein the acid catalizable crosslinking agent forms tertiary benzylic carbonium ions.

11. The aqueous base developable photoresist composition of claim 10 wherein said acid catalizable crosslinking agent is selected from the group consisting of α,α,α',α'-tetramethyl-1,4-benzene dimethanol, α,α,α',α'-tetramethylbenzene dimethanol, and α,α,α',α',α'',α''-hexamethyl-1,3,5-benzene trimethanol.

12. The aqueous base developable photoresist composition of claim 1 wherein the functional groups of said aromatic polymer resin are phenolic hydroxy groups.

13. The aqueous base developable photoresist composition of claim 1 wherein the radiation degradable acid generator which is adapted to absorb imaging radiation is selected from the group consisting of metallic and nonmetallic onium salts and non-metallic sulfonic acid precursors which generate strong acids upon exposure to radiation.

14. The aqueous base developable photoresist composition of claim 13 wherein the nonmetallic onium salts are selected from the group consisting of diaryliodonium salts and triarylsulfonium salts.

15. The aqueous base developable photoresist composition of claim 14 wherein the nonmetallic oniums are selected from the group consisting of diaryliodonium and triarylsulfonium triflates, benzene sulfonates, and tosylates.

16. The aqueous base developable photoresist composition of claim 13 wherein the non-metallic sulfonic acid precursors are N-sulfonyloxyimides of the form

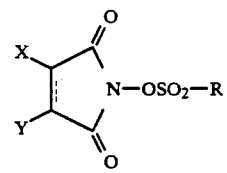

where R is selected from the group consisting of toluene, benzene—CF₃, —CF₂CF₃, —CF₂CF₂H, and —(CF₂)ₙ—Z, and n=1 to 4, where Z is H, alkyl, aryl,

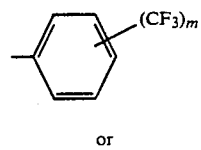

or

-continued

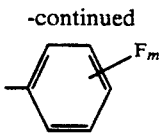

where m=1 to 5, where X any Y either (1) form a cyclic or polycyclic ring which may contain one or more hetero atoms, (2) form a fused aromatic ring, (3) may be independently H, alkyl or aryl, (4) may be attached to another sulfonyloxyimide-containing residue, or (5) may be attached to a polymeric chain or backbone.

17. The aqueous developable photoresist composition of claim 1 which further includes an effective amount of an aromatic dye which functions as an energy transfer agent at the wavelength of the imagaing radiation incident on said film during imaging.

18. The aqueous developable photoresist composition of claim 17 wherein said aromatic dye is selected from the group consisting of phenoxymethyl anthracene, anthracene methanol, 9,10-diphenylanthracene, and phenanthracene, and acetylbiphenyl.

19. The aqueous base developable photoresist composition of claim 1 wherein the oligomeric diol additive is selected from the group consisting of polytetrahydrofuran, polyethylene glycol and polypropylene glycol.

20. The aqueous base developable photoresist composition of claim 1 wherein the film forming aromatic polymer resin is a polymer comprising phenolic hydroxy groups and wherein the acid catalyzable crosslinking agent comprises a compound having at least one aromatic ring with at least one electron donating group on the at least one aromatic ring which stabilizes the carbonium ion formed from the crosslinking agent upon reaction with acid.

21. The aqueous base developable photoresist composition of claim 15 wherein the aromatic polymer resin is selected from the group consisting of poly(hydroxystyrene), novolak and, poly(p-hydroxybenzyl)silsesquioxane.

22. The aqueous base developable photoresist composition of claim 21 wherein the novolak resin is an alkylphenol-formaldehyde condensation product.

23. The aqueous base developable photoresist composition of claim 22 wherein the alkylphenol-formaldehyde condensation product is selected from the group consisting of cresol novolaks, ethylphenol novolaks, and xylenol novolaks.

24. The aqueous base developable photoresist composition of claim 21 wherein the phenolic hydroxy group containing polymer is selected from the group consisting of poly(p-hydroxybenzylsilsesqui-oxane), poly(p-hydroxyphenylsilsesquioxane), and poly(p-hydroxyphenyl)methylsilane.

* * * * *